United States Patent
Ikeda et al.

(10) Patent No.: US 11,149,357 B2
(45) Date of Patent: Oct. 19, 2021

(54) METHOD FOR MANUFACTURING A SILICON CARBIDE SINGLE CRYSTAL BY ADJUSTING THE POSITION OF A HOLE IN A TOP OF THE GROWTH CONTAINER RELATIVE TO THE OFF ANGLE OF THE SILICON CARBIDE SUBSTRATE

(71) Applicant: SHIN-ETSU HANDOTAI CO., LTD., Tokyo (JP)

(72) Inventors: Hitoshi Ikeda, Chiyoda-ku (JP); Toru Takahashi, Annaka (JP); Tetsuro Aoyama, Annaka (JP); Yuichi Matsumoto, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/958,762

(22) PCT Filed: Nov. 14, 2018

(86) PCT No.: PCT/JP2018/042130
§ 371 (c)(1),
(2) Date: Jun. 29, 2020

(87) PCT Pub. No.: WO2019/130873
PCT Pub. Date: Jul. 4, 2019

(65) Prior Publication Data
US 2020/0332436 A1   Oct. 22, 2020

(30) Foreign Application Priority Data
Dec. 27, 2017 (JP) .............................. JP2017-251853

(51) Int. Cl.
*C30B 23/06* (2006.01)
*C30B 23/00* (2006.01)
(Continued)

(52) U.S. Cl.
CPC .......... *C30B 23/002* (2013.01); *C30B 23/025* (2013.01); *C30B 29/36* (2013.01)

(58) Field of Classification Search
CPC ..... C30B 23/002; C30B 23/02; C30B 23/025; C30B 23/06; C30B 23/063; C30B 29/00; C30B 29/10; C30B 29/36
(Continued)

(56) References Cited

U.S. PATENT DOCUMENTS

| | | | |
|---|---|---|---|
| 2005/0126471 A1 | 6/2005 | Jenny et al. | |
| 2006/0032434 A1 | 2/2006 | Mueller et al. | |

(Continued)

FOREIGN PATENT DOCUMENTS

| | | |
|---|---|---|
| EP | 2314737 A2 | 4/2011 |
| EP | 2388359 A2 | 11/2011 |

(Continued)

OTHER PUBLICATIONS

Jan. 8, 2019 International Search Report issued in International Patent Application No. PCT/JP2018/042130.
(Continued)

Primary Examiner — Kenneth A Bratland, Jr.
(74) Attorney, Agent, or Firm — Oliff PLC

(57) ABSTRACT

A method for manufacturing a SiC single crystal having a growth container surrounded by a heat-insulating material, a seed crystal substrate disposed inside a top at a center of the container, a silicon carbide raw material disposed at a bottom of the container to sublimate and grow a SiC crystal to allow a center of the hole to deviate from a center position of the seed substrate to a position on a periphery side, a SiC substrate having a main surface tilted from a {0001} plane wherein a basal plane is used and grown with the seed substrate so that a direction of a component of a normal vector of the basal plane of the seed substrate parallel to the
(Continued)

main surface and an eccentric direction of the hole are opposite directions in a cross-sectional view including the center of the seed substrate and the center of the hole.

4 Claims, 7 Drawing Sheets

(51) Int. Cl.
  *C30B 23/02* (2006.01)
  *C30B 29/36* (2006.01)
(58) Field of Classification Search
  USPC ........ 117/84–85, 88, 94, 101, 106, 200–201, 117/204, 937, 951
  See application file for complete search history.

(56) References Cited

U.S. PATENT DOCUMENTS

| | | | |
|---|---|---|---|
| 2013/0280466 | A1 | 10/2013 | Zwieback et al. |
| 2016/0138186 | A1 | 5/2016 | Hori et al. |
| 2017/0191183 | A1 | 7/2017 | Sasaki |
| 2017/0260647 | A1 | 9/2017 | Ujihara et al. |
| 2017/0342593 | A1* | 11/2017 | Sato ..................... C01B 32/963 |

FOREIGN PATENT DOCUMENTS

| | | |
|---|---|---|
| EP | 2851456 A1 | 3/2015 |
| JP | 2000-191399 A | 7/2000 |
| JP | 2005-239465 A | 9/2005 |
| JP | 2008-001532 A | 1/2008 |
| JP | 2008-509872 A | 4/2008 |
| JP | 2012-131679 A | 7/2012 |
| JP | 2012131679 A * | 7/2012 |
| JP | 2017-105676 A | 6/2017 |
| JP | 2017-154926 A | 9/2017 |
| WO | 2016/088883 A1 | 6/2016 |

OTHER PUBLICATIONS

Jun. 30, 2020 International Preliminary Report on Patentability issued in International Patent Application No. PCT/JP2018/042130.
May 20, 2021 Office Action issued in Chinese Patent Application No. 201880083603.9.
Jul. 30, 2021 Extended European Search Report issued in European Patent Application No. 18893350.1.

* cited by examiner

[FIG. 1]
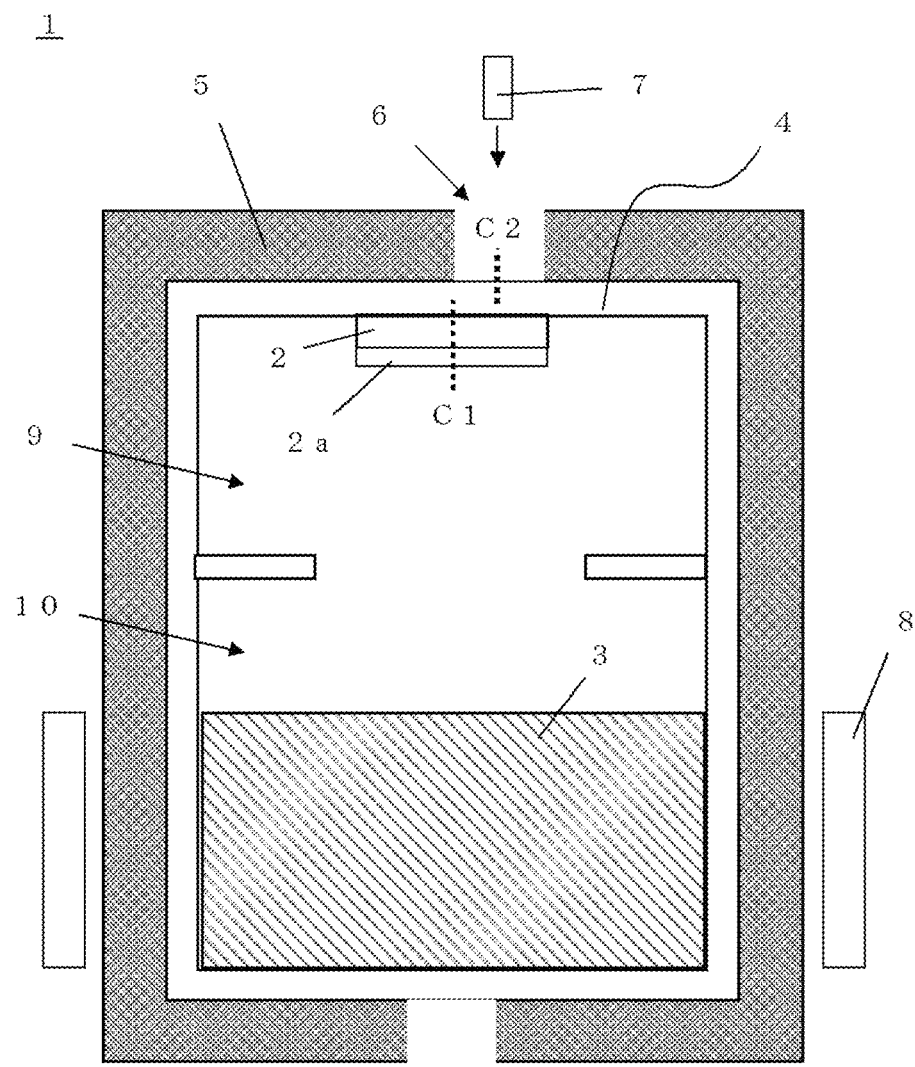

[FIG. 2]
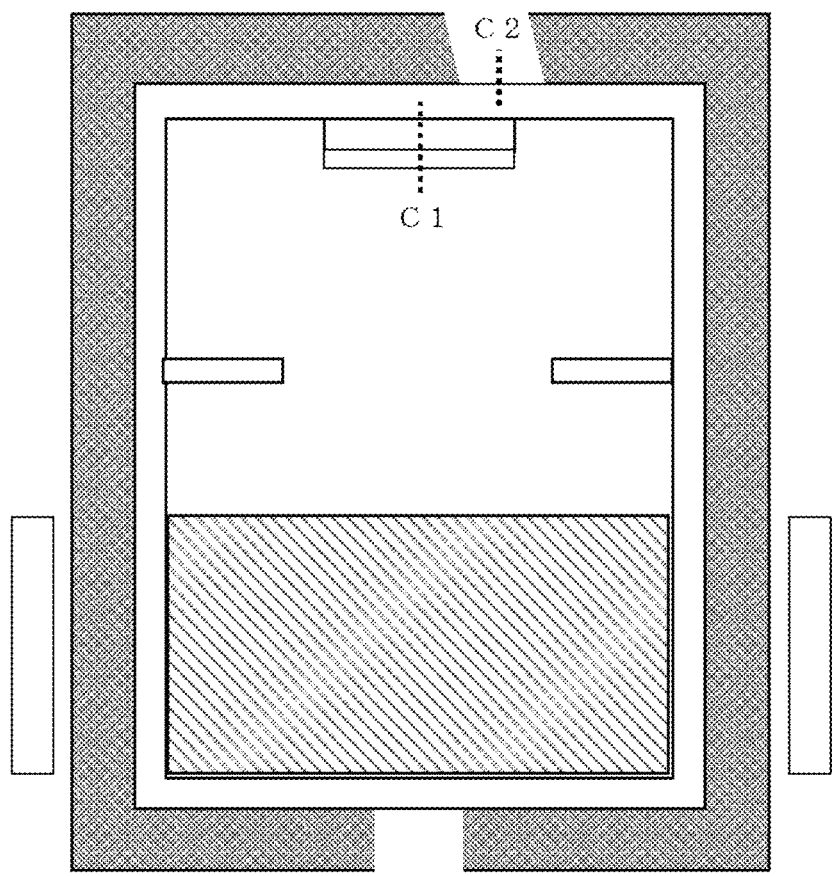

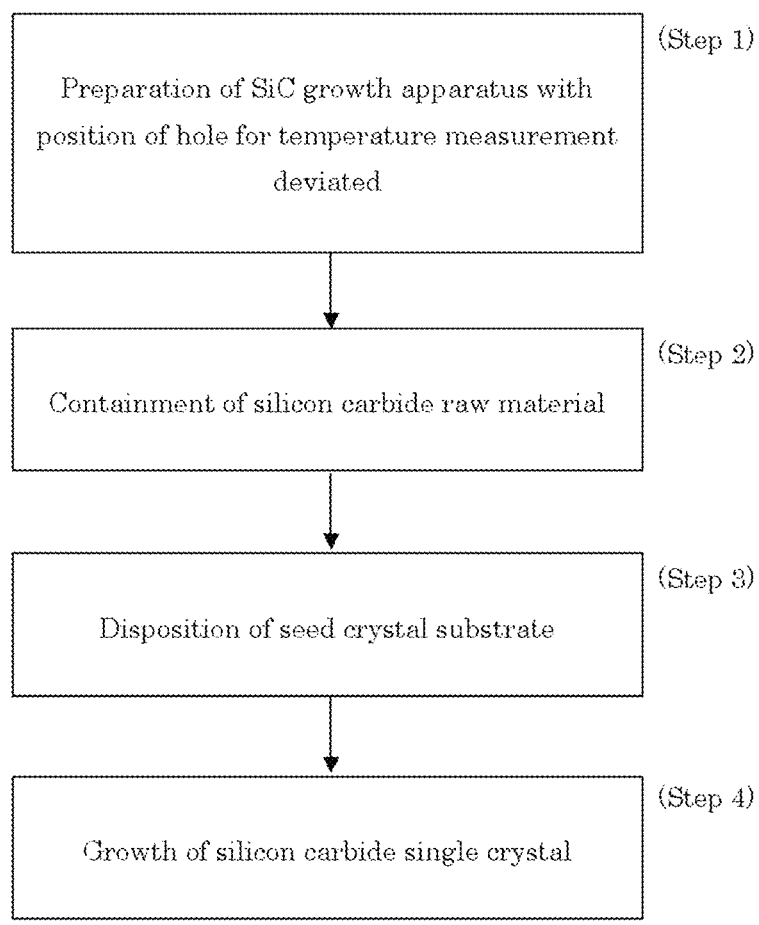

[FIG. 4]
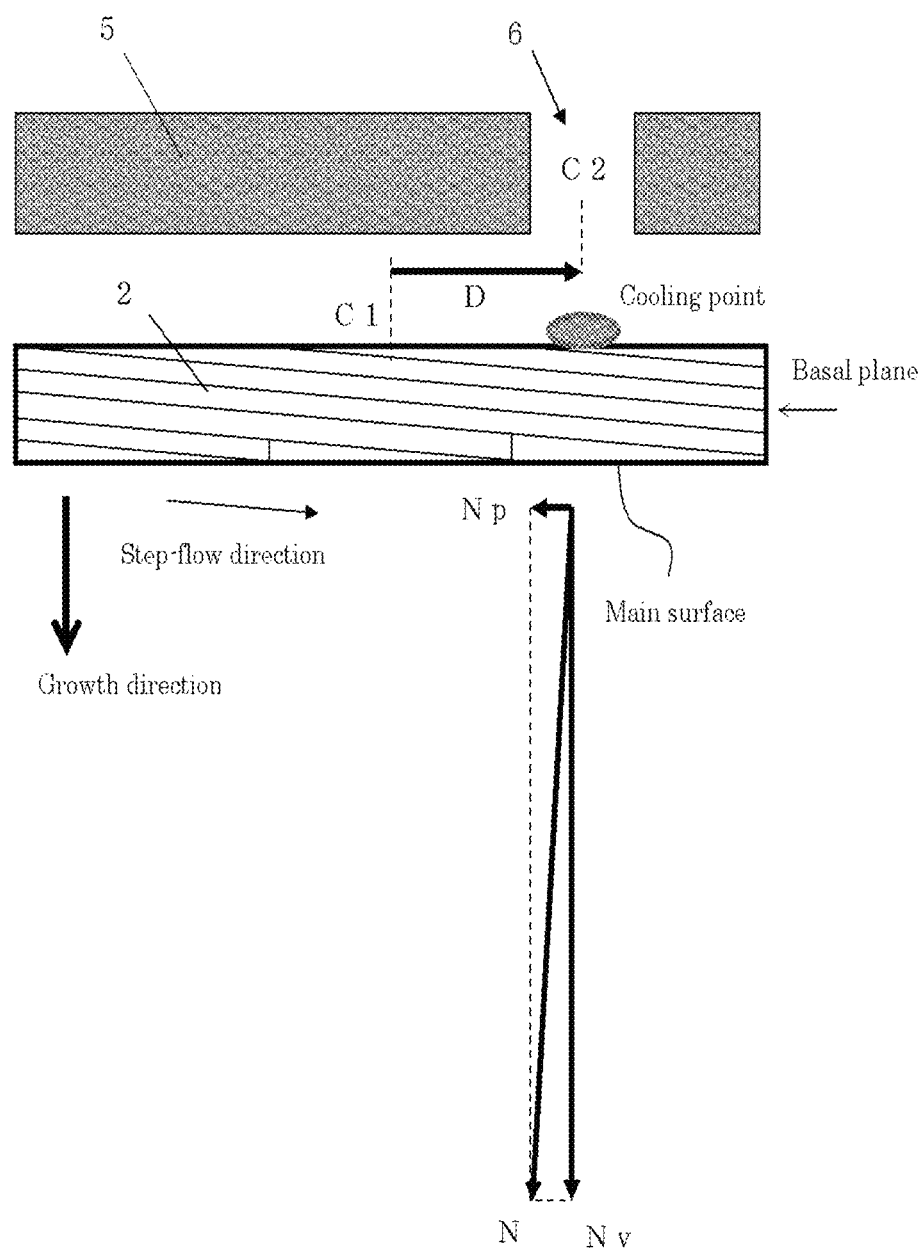

[FIG. 5]
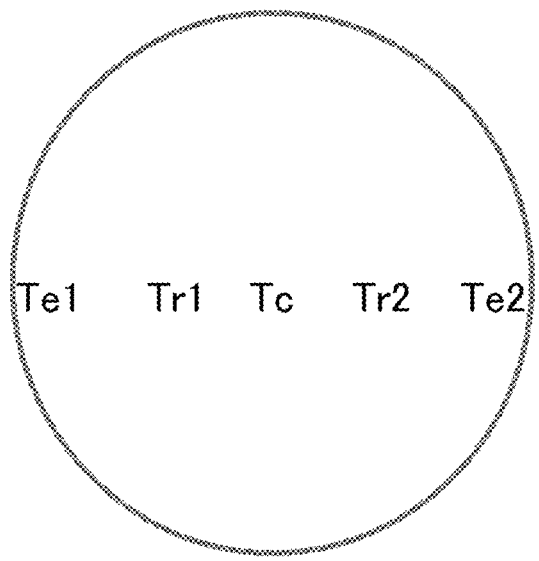
[FIG. 6]
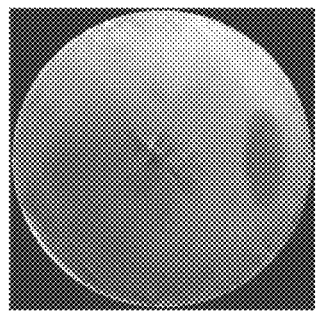
[FIG. 7]
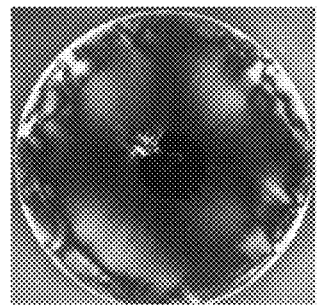

[FIG. 8]
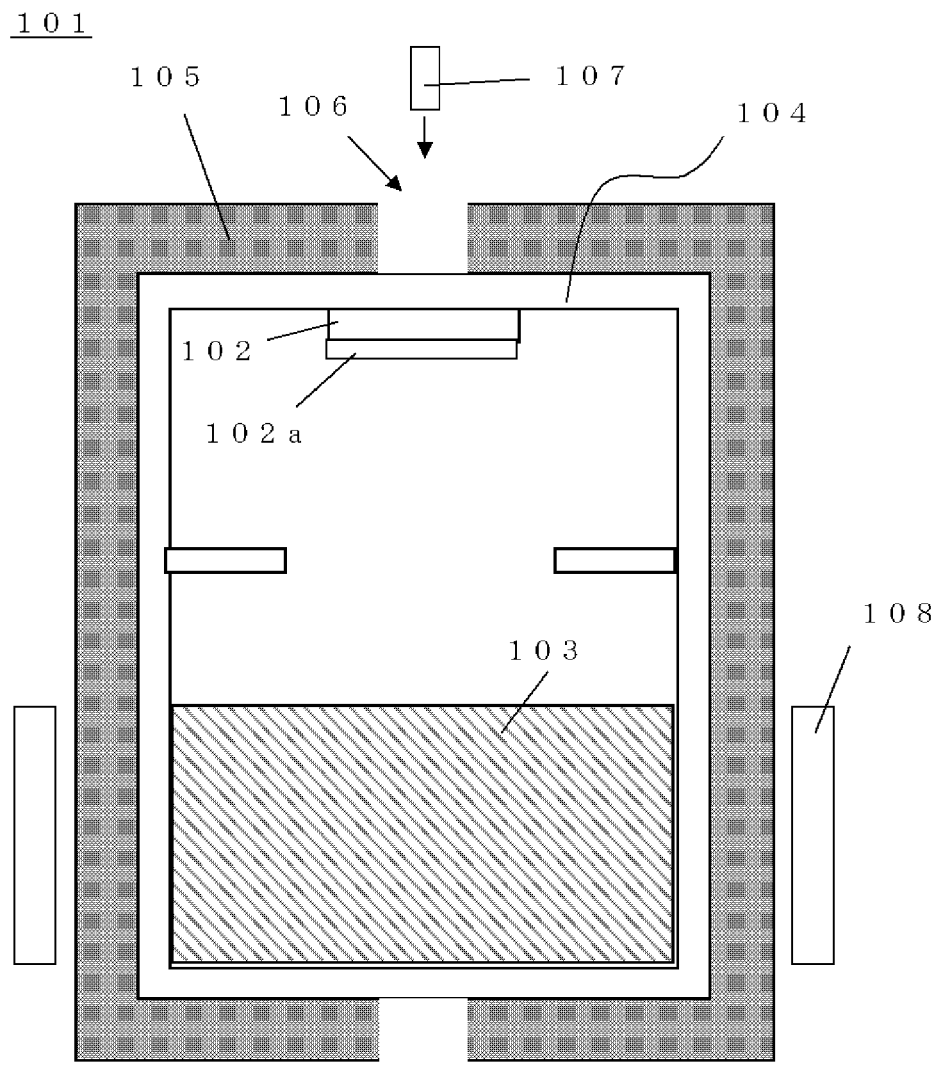
PRIOR ART

[FIG. 9]
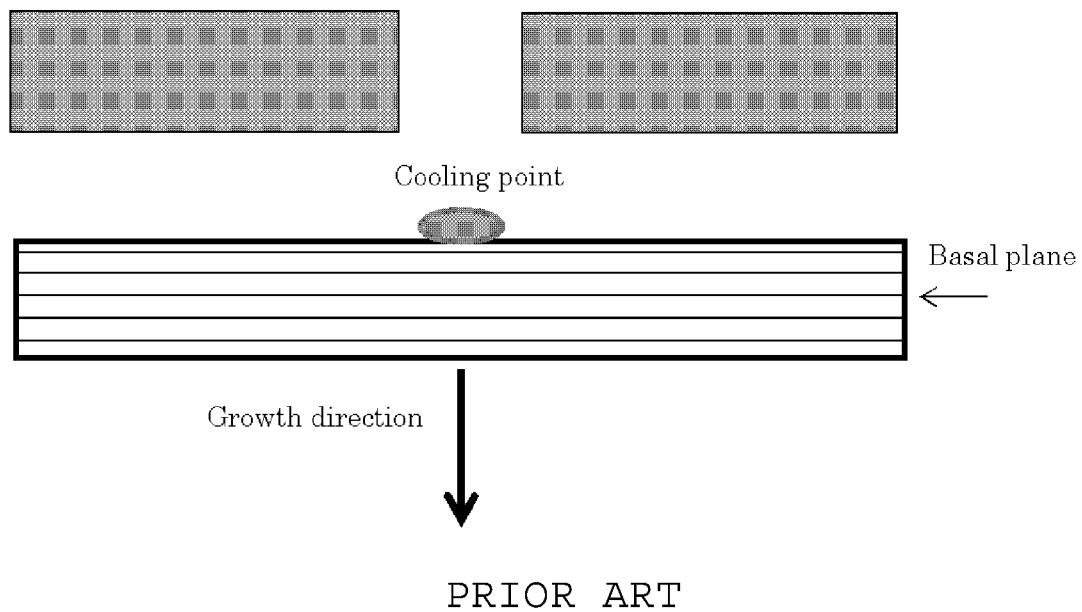
PRIOR ART

METHOD FOR MANUFACTURING A SILICON CARBIDE SINGLE CRYSTAL BY ADJUSTING THE POSITION OF A HOLE IN A TOP OF THE GROWTH CONTAINER RELATIVE TO THE OFF ANGLE OF THE SILICON CARBIDE SUBSTRATE

TECHNICAL FIELD

The present invention relates to a method for manufacturing a silicon carbide single crystal in which a silicon carbide single crystal is grown by a sublimation method.

BACKGROUND ART

In recent years, an inverter circuit has come to be used frequently in electric vehicles and electric cooling and heating equipment, and a semiconductor crystal of silicon carbide (hereinafter, also referred to as SiC) is desired owing to characteristics that there is little electric power loss and breakdown voltage can be set higher than a device using a semiconductor Si crystal.

As a typical and practical method for growing a crystal with a high melting point or a crystal that is difficult to grow by liquid phase growth such as SiC, a sublimation method exists. The sublimation method is a method in which a solid raw material is sublimated inside a container at a high temperature of approximately 2000° C. or higher to grow a crystal on a seed crystal facing the raw material (Patent Document 1).

However, crystal growth of SiC requires high temperature for sublimation and a growth apparatus requires temperature control at a high temperature. In addition, to stabilize the pressure of a sublimated substance, the pressure inside the container needs to be stably controlled. Furthermore, crystal growth of SiC depends on sublimation rate, and compared to Si grown by the Czochralski method, or GaAs by an LPE method, and the like, growth rated is relatively quite slow. Accordingly, a long time is spent for growing. Fortunately, recent development of control equipment and development of computers, personal computers, and the like make it possible to control pressure and temperature stably for a long period of time.

Specifically, the method for growing SiC by the sublimation method is performed using a SiC growth apparatus 101 as shown in FIG. 8. The sublimation method is a method of placing a silicon carbide raw material 103 inside a growth container 104, heating with a heater 108, and growing a crystal on a seed crystal substrate 102 disposed inside the growth container 104 (silicon carbide single crystal 102a).

The growth container 104 is disposed inside a vacuum quartz pipe or inside a vacuum chamber, is once filled with a gas with low activity, and an atmosphere thereof has a pressure lower than an atmospheric pressure so that the sublimation rate of the SiC is raised.

On the outside of the growth container 104, a heat-insulating material 105 is disposed. A part of the heat-insulating material 105 has at least one hole 106 for measuring temperature with a temperature measuring equipment (pyrometer) 10. Accordingly, some heat escapes through the hole.

The growth container is mainly formed from carbon material, and has permeability so that the pressures inside and outside the growth container become equal. However, when sublimation is initiated, sublimated gas leaks outside the growth container.

In practice, the silicon carbide raw material is disposed at the bottom of the growth container. The silicon carbide raw material is solid, and is sublimated under high temperature and reduced pressure. The sublimated material grows as a single crystal on the seed crystal substrate facing the material. In the case of SiC, the single crystal includes a cubic crystal and a hexagonal crystal, and furthermore, among hexagonal crystals, 4H, 6H, and the like are known as typical polytypes.

In many cases, the same type of single crystal grows; for example, 4H grows on a 4H type seed crystal (Patent Document 2).

Many penetration defects (Micropipe; micropipe) extending continuously in the growth direction are present in a SiC single crystal obtained by the method for growing a SiC single crystal as described above. The penetration defects are generated near the seed crystal in early growth, and are propagated to the top of the crystal as the crystal grows.

In a device using a substrate with such penetration defects present, the performance thereof is considerably lowered. For example, if a light-emitting diode is made, an increase in leak current and degradation of luminous intensity occur. In addition, in a high-power element, it is reported that breakdown voltage is not maintained. Therefore, in order to improve the performance of a device using a SiC single crystal substrate, or to improve the yield within the wafer, it is important to reduce these penetration defects.

CITATION LIST

Patent Literature

Patent Document 1: Japanese Unexamined Patent Application Publication No. 2000-191399

Patent Document 2: Japanese Unexamined Patent Application Publication No. 2005-239465

SUMMARY OF INVENTION

Technical Problem

The present invention has been made in view of the above-described problem, and an object thereof is to provide a method for manufacturing a silicon carbide single crystal with reduced penetration defects.

Solution to Problem

To achieve the object, the present invention provides a method for manufacturing a silicon carbide single crystal in which a growth container is surrounded by a heat-insulating material with a hole for temperature measurement provided in a top thereof, a seed crystal substrate is disposed in a center at a top on an inside of the growth container, a silicon carbide raw material is disposed at a bottom of the growth container, and the silicon carbide raw material is sublimated to grow a silicon carbide single crystal on the seed crystal substrate, wherein to allow a position of a center of the hole for temperature measurement in the heat-insulating material to deviate from a position of a center of the seed crystal substrate disposed inside the growth container, the hole for temperature measurement is provided to deviate to a position on a periphery side relative to a center of the seed crystal substrate disposed inside the growth container, a silicon carbide single crystal substrate having a main surface tilted by an off angle from a {0001} plane which is a basal plane is used as the seed crystal substrate, and the silicon carbide single crystal is grown with the seed crystal substrate disposed inside the growth container so that a direction of a component of a normal vector of the basal plane of the seed crystal substrate parallel to the main surface of the seed crystal substrate and an eccentric direction of the center of the hole for temperature measurement relative to the center of the seed crystal substrate are opposite directions in a cross-sectional view including the center of the seed crystal substrate inside the growth container and the center of the hole for temperature measurement in the heat-insulating material.

Such a disposition position of the hole for temperature measurement, and preparation of the above-described type of seed crystal substrate and disposition position and disposition direction thereof allow growth of a silicon carbide single crystal with reduced distortion and penetration defects.

In this event, the off angle of the seed crystal substrate may be 0.5 to 10 degrees.

Such an off angle allows efficient performance of step-flow growth.

Furthermore, the hole for temperature measurement in the heat-insulating material may be provided so that the center of the hole is positioned towards the periphery side than a one-third-radius position of the seed crystal substrate from the center of the seed crystal substrate disposed inside the growth container.

In this manner, the silicon carbide single crystal can be grown on the seed crystal substrate in the opposite direction to the step flow within a wide range on the seed crystal substrate plane with more certainty, and a silicon carbide single crystal with further reduced distortion and penetration defects can be grown.

Advantageous Effects of Invention

By the inventive method for manufacturing a silicon carbide single crystal, a silicon carbide single crystal with reduced distortion and penetration defects can be manufactured.

BRIEF DESCRIPTION OF DRAWINGS

FIG. 1 is a schematic cross-sectional view showing an example of a SiC growth apparatus on which the inventive method for manufacturing a silicon carbide single crystal can be performed.

FIG. 2 is a schematic cross-sectional view showing an example of a different embodiment of the hole for temperature measurement in the SiC growth apparatus.

FIG. 3 is a process drawing showing an example of the flow of the inventive method for manufacturing a silicon carbide single crystal.

FIG. 4 is an explanatory diagram showing the disposition direction of the seed crystal substrate in the present invention.

FIG. 5 is an explanatory diagram showing a temperature-measurement position in the Example and the Comparative Example.

FIG. 6 is a measurement diagram showing a wafer-plane-distortion distribution in the Example.

FIG. 7 is a measurement diagram showing a wafer-plane-distortion distribution in the Comparative Example.

FIG. 8 is a schematic cross-sectional view showing an example of a SiC growth apparatus used in a conventional method.

FIG. 9 is an explanatory diagram showing the relation between a seed crystal substrate and a cooling point in the Comparative Example.

DESCRIPTION OF EMBODIMENTS

Hereinafter, the present invention will be described in detail as an example of embodiment with reference to drawings, but the present invention is not limited thereto.

FIG. 1 is a schematic cross-sectional view showing an example of a SiC growth apparatus on which the inventive method for manufacturing a silicon carbide single crystal can be performed.

As shown in FIG. 1, a SiC growth apparatus 1 is provided with a growth container 4 for containing a seed crystal substrate 2 and a silicon carbide raw material 3 (also referred to as SiC raw material), a heat-insulating material 5 surrounding the growth container 4, a temperature measuring equipment 7 for measuring the temperature inside the growth container 4 through a hole for temperature measurement (hereinafter, also referred to simply as a hole) 6 provided so as to penetrate the heat-insulating material 5, and a heater 8 for heating the SiC raw material.

The growth container 4 has a growth chamber 9 for disposing the seed crystal substrate 2, and a sublimation chamber 10 for disposing the SiC raw material 3, and is formed from, for example, a heat-resistant graphite. In addition, when growing a crystal, the crystal growth (growth of a silicon carbide single crystal 2a) is performed in an inert gas atmosphere under reduced pressure by setting the growth container inside a quartz pipe or chamber not shown in the drawing and supplying an inert gas such as Ar while vacuum exhausting. In this event, in the case of an n type, nitrogen may be added.

As the heater 8, a heater for performing RH (resistance heating) or RF (radiofrequency) heating can be used. In addition, by using a pyrometer as the temperature measuring equipment 7, temperature measurement can be performed with precision through the hole 6 for temperature measurement in the heat-insulating material 5 from outside the growth container 4 without contact.

Here, the positions of the seed crystal substrate and the hole for temperature measurement in the SiC growth apparatus in the present invention will be described in detail.

The seed crystal substrate is disposed inside the growth container, more specifically, disposed in the center at the top on the inside of the growth container as shown in FIG. 1.

In addition, the hole for temperature measurement is provided in the top of the heat-insulating material. More specifically, to allow the position C2 of the center of the hole to deviate from the position C1 of the center of the seed crystal substrate inside the growth container (in other words, the center position of the top of the growth container) as shown in FIG. 1, the hole is provided to deviate to a position on a periphery side relative to the center C1 of the seed crystal substrate.

Note that here, this position C2 of the center of the hole for temperature measurement, which is a penetrating hole that connects the outside and the inside of the heat-insulating material provided in the top of the heat-insulating material, indicates the center position of the opening on the inside of the heat-insulating material (the seed crystal substrate side).

Furthermore, the hole is more preferably provided so that the center position C2 of the hole is positioned towards the periphery side than a one-third-radius position of the seed crystal substrate from the center position C1 of the seed crystal substrate.

Furthermore, in the example shown in FIG. 1, the hole is provided in a vertical direction, but the invention is not limited thereto, and for example, the hole may be provided in a slanting direction as shown in FIG. 2, which is a different embodiment regarding the shape of the hole. In any case, it is sufficient to satisfy the above relation between the center position C1 of the seed crystal substrate and the center position C2 of the hole. In addition to this, the size of the hole, etc. can be appropriately determined considering, for example, ease of temperature measurement.

Hereinafter, the inventive method for manufacturing a silicon carbide single crystal by a sublimation method will be described with reference to the process drawing of FIG. 3.

Firstly, a SiC growth apparatus 1 with a hole 6 for temperature measurement in a deviated position as in FIG. 1 is prepared (step 1). That is, an apparatus having, to allow the center position C2 of the hole 6 for temperature measurement to deviate from the center position C1 of the seed crystal substrate 2 to be disposed later (center position of the top of the growth container), the hole 6 provided to deviate to a position on the periphery side relative to the center position C1 of the seed crystal substrate 2 is prepared.

Next, the SiC raw material 3 is contained in the sublimation chamber 10 inside the growth container 4 (step 2), and the seed crystal substrate 2 is prepared and disposed in the center position at the top of the growth chamber 9 (step 3). Here, a silicon carbide single crystal substrate having a main surface tilted by an off angle from a {0001} plane which is a basal plane is prepared as the seed crystal substrate 2. Furthermore, the degree of this off angle is not particularly limited, but for example, may be 0.5 to 10 degrees. Using such a seed crystal substrate 2 makes step-flow growth possible, and furthermore, the relation between the disposition positions of the seed crystal substrate 2 or the hole 6 for temperature measurement and the disposition direction of the seed crystal substrate 2 to be described in detail later makes it possible to reduce distortion and penetration defects in the silicon carbide single crystal 2a to be grown. Moreover, by setting the off angle to the above-described value, a more efficient step-flow growth is possible.

In addition, the manner in which the seed crystal substrate 2 is disposed in this event (direction of disposition) will be described with reference to FIG. 4. FIG. 4 is a diagram explaining the disposition direction of the seed crystal substrate 2, and here, only the hole 6 for temperature measurement and the seed crystal substrate 2 disposed in the top center of the growth container 4 are simply described. Note that FIG. 4 is a cross-sectional view including the center C1 of the seed crystal substrate and the center C2 of the hole for temperature measurement. In addition, a single crystal substrate having a crystal growth plane tilted from the {0001} plane which is a basal plane by 0.5 to 10 degrees in a <11-20> direction is given as an example of the seed crystal substrate 2.

As described above, the seed crystal substrate itself has a main surface tilted by an off angle from the basal plane. Accordingly, the normal vector N of the basal plane is tilted from the direction perpendicular to the main surface of the seed crystal substrate 2, and can be resolved in a component Nv in the direction perpendicular to the main surface and a component Np in a direction parallel to the main surface. In this example, the component Np in the direction parallel to the main surface points to the left.

Incidentally, considering the center position C2 of the hole for temperature measurement, the center position C2 deviates from the center position C1 of a hole of the seed crystal substrate as described above, and here, the direction of this deviation is defined as an eccentric direction D. In this example, the eccentric direction D points to the right.

In the present invention, the direction of the seed crystal substrate is adjusted and arranged so that the above-described Np (here, pointing left) and D (here, pointing right) are in opposite directions, as shown in FIG. 4. Note that the directions of Np and D are not limited to the directions shown in FIG. 4, and naturally, contrary to this, may each be disposed so that Np points to the right and D points to the left, respectively.

Next, for example, with a flow rate of 1000 sccm or less of argon gas and nitrogen gas altogether, and under a pressure of 1 to 20 torr (1.3 hPa to 2.7×10 hPa), a SiC single crystal 2a is grown on the seed crystal substrate 2 at a temperature of 2000 to 2300° C. by heating with a heater (step 4).

In this event, as described in FIG. 4 as a cooling point, the point on the seed crystal substrate 2 corresponding to the position of the hole 6 for temperature measurement has the lowest temperature, and the position having the lowest temperature becomes the starting point of the silicon carbide single crystal growth. In the case of FIG. 4, the range to the left of the cooling point is wider than the range to the right of the cooling point, and in this wide range, the crystal will grow in the opposite direction to the step-flow direction in the direction parallel to the main surface.

By such a method for manufacturing of the present invention, a favorable silicon carbide single crystal with few penetration defects can be manufactured. In addition, distortion that occurs on the plane of a silicon carbide single crystal manufactured by a conventional method can be suppressed.

Note that in FIG. 1 and FIG. 4, an example is shown in which the hole 6 is provided so that the center position C2 of the hole for temperature measurement is in a one-half-radius position of the seed crystal substrate 2 from the center position C1 of the seed crystal substrate. However, it is sufficient if the hole deviates to a position towards the periphery side, and the degree of deviation is not particularly limited. However, as stated above, the center position C2 of the hole is more preferably positioned towards the periphery side than a one-third-radius position of the seed crystal substrate from the center position C1 of the seed crystal substrate. In this manner, the silicon carbide single crystal can be grown in the opposite direction to the step flow with a wide range on the seed crystal substrate plane with more certainty when the silicon carbide single crystal 2a is actually grown on the seed crystal substrate 2. Accordingly, a silicon carbide single crystal with even less distortion and penetration defects can be obtained with more certainty.

EXAMPLE

Hereinafter, the present invention will be specifically described with reference to an Example and a Comparative Example, but the present invention is not limited thereto.

Example

Using the SiC growth apparatus shown in FIG. 1, a SiC single crystal with a diameter of 4 inches (100 mm) was grown under the following growth conditions by the inventive method for manufacturing a silicon carbide single crystal.

<Conditions>

Seed crystal substrate . . . SiC single crystal substrate with a diameter of 4 inches (100 mm) having a main surface tilted from the {0001} plane by 4° in the <11-20> direction Growth temperature . . . 2200° C.

Pressure . . . 10 Torr (1.3×10 hPa)

Atmosphere . . . argon gas and nitrogen gas

Note that, as shown in FIG. 1, the hole for temperature measurement was made in a one-half-radius position of the seed crystal substrate from the center of the seed crystal substrate, and as shown in FIG. 4, the seed crystal substrate was disposed so that the direction of the component of the normal vector in the crystal growth direction of the basal plane of the seed crystal substrate, the component being parallel to the main surface of the seed crystal substrate, and the eccentric direction of the hole were opposite directions, and crystal growth was performed.

In this event, the relation between the temperature measurement positions on the seed crystal substrate plane shown in FIG. 5 and the temperature was: $Tr2<Tc<Tr1<Te1$, and $Tr2<Te2$.

That is, the point corresponding to the position of the hole for temperature measurement had the lowest temperature (cooling point).

Note that the growth plane of the seed crystal substrate in FIG. 5 is the front side of the page, and the component of the normal vector in the crystal growth direction of the basal plane, the component being parallel to the main surface of the seed crystal substrate, is a leftward direction.

After the SiC single crystal growth, a wafer was cut out with a multi wire saw, ground, mirror-polished, and CMP polished, then distribution of distortion on the plane was investigated by photoelasticity evaluation. The result is shown in FIG. 6.

It can be observed that the distortion in the central portion and the peripheral portion of the plane is weakened compared to the Comparative Example described later.

Furthermore, in order to investigate micropipes (penetration defects), the wafer surface was etched by alkali etching, and the micropipes were counted using a stereomicroscope. The result was $0.02/cm^2$, and the micropipes were considerably reduced compared to the Comparative Example described later.

Comparative Example

A SiC growth apparatus as in FIG. 8 was prepared to manufacture a silicon carbide single crystal by a conventional method for manufacturing a silicon carbide single crystal. Except that an apparatus with a hole made so that the center position of the hole for temperature measurement corresponds to the center of the seed crystal substrate was used and that a SiC single crystal substrate having the {0001} plane as the main surface was used as the seed crystal substrate as shown in FIG. 8, a SiC single crystal with a diameter of 4 inches (100 mm) was grown under the same conditions as the Example.

In this event, the relation between the temperature measurement positions on the seed crystal substrate plane shown in FIG. 5 and the temperature was: $Tc<Tr1=Tr2<Te1=Te2$. That is, the point corresponding to the position of the hole for temperature measurement (the center) had the lowest temperature (cooling point). The relation between the seed crystal substrate and the cooling point in this event is shown in FIG. 9.

After the SiC single crystal growth, a wafer was cut out with a multi wire saw, ground, mirror-polished, and CMP polished, then distribution of distortion on the plane was investigated by photoelasticity evaluation. The result is shown in FIG. 7.

Compared to the Example, distortion can be observed in the central portion and the peripheral portion.

In addition, on counting the micropipes using a stereomicroscope as in the Example, there were $2.4/cm^2$.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a silicon carbide single crystal in which a growth container is surrounded by a heat-insulating material with a hole for temperature measurement provided in a top thereof, a seed crystal substrate is disposed in a center at a top on an inside of the growth container, a silicon carbide raw material is disposed at a bottom of the growth container, and the silicon carbide raw material is sublimated to grow a silicon carbide single crystal on the seed crystal substrate, wherein to allow a position of a center of the hole for temperature measurement in the heat-insulating material to deviate from a position of a center of the seed crystal substrate disposed inside the growth container, the hole for temperature measurement is provided to deviate to a position on a periphery side relative to a center of the seed crystal substrate disposed inside the growth container, a silicon carbide single crystal substrate having a main surface tilted by an off angle from a {0001} plane which is a basal plane is used as the seed crystal substrate, and the silicon carbide single crystal is grown with the seed crystal substrate disposed inside the growth container so that a direction of a component of a normal vector of the basal plane of the seed crystal substrate parallel to the main surface of the seed crystal substrate and an eccentric direction of the center of the hole for temperature measurement relative to the center of the seed crystal substrate are opposite directions in a cross-sectional view including the center of the seed crystal substrate inside the growth container and the center of the hole for temperature measurement in the heat-insulating material.

2. The method for manufacturing a silicon carbide single crystal according to claim 1, wherein the off angle of the seed crystal substrate is 0.5 to 10 degrees.

3. The method for manufacturing a silicon carbide single crystal according to claim 1, wherein the hole for temperature measurement in the heat-insulating material is provided so that the center of the hole is positioned towards the periphery side than a one-third-radius position of the seed crystal substrate from the center of the seed crystal substrate disposed inside the growth container.

4. The method for manufacturing a silicon carbide single crystal according to claim 2, wherein the hole for temperature measurement in the heat-insulating material is provided so that the center of the hole is positioned towards the periphery side than a one-third-radius position of the seed crystal substrate from the center of the seed crystal substrate disposed inside the growth container.

\* \* \* \* \*